United States Patent [19]
Lu et al.

[11] Patent Number: 5,371,169
[45] Date of Patent: Dec. 6, 1994

[54] NOVOLAK RESIN MIXTURES

[75] Inventors: Ping H. Lu, Edison; Anthony Canize, Flemington, both of N.J.; Dinesh N. Khanna, East Greenwich; M. Dalil Rahman, Warwick, both of R.I.

[73] Assignee: Hoechst Celanese Corporation, Somerville, N.J.

[21] Appl. No.: 953,031

[22] Filed: Sep. 28, 1992

[51] Int. Cl.$^5$ .............................................. C08G 14/04
[52] U.S. Cl. .................... 528/155; 528/129; 525/480; 525/491; 525/501
[58] Field of Search ............... 528/129, 155; 525/480, 525/491, 501

[56] References Cited

U.S. PATENT DOCUMENTS

| | | | |
|---|---|---|---|
| 3,666,473 | 5/1972 | Colom et al. | 430/192 |
| 4,551,409 | 11/1985 | Gulla et al. | 430/192 |
| 4,797,346 | 1/1989 | Yamamoto et al. | 430/192 |
| 4,988,601 | 1/1991 | Ushirogouchi et al. | 430/192 |

FOREIGN PATENT DOCUMENTS

| | | | |
|---|---|---|---|
| 0365318 | 4/1990 | European Pat. Off. | 430/192 |
| 2181441 | 4/1987 | United Kingdom | 430/192 |

OTHER PUBLICATIONS

Patent Abstracts of Japan, vol. 10, No. 291 (M-522) Oct. 3, 1986 & JP-A-61,106,297 (Konishiro Photo Ind. Co. Ltd.) May 24, 1986.

IBM Technical Disclosure Bulletin, vol. 25, No. 8, Jan. 1983, New York, US, pp. 4401–4403, L. P. Bushnell et al "Mixed-resin Photoresist System for Mid & Deel Ultraviolet".

Derwent Publications Ltd., London, GB; AN 7753080Y & JP-A-52,071,224 (Okyo Shibaura Elec. Ltd.) Jun. 14, 1977.

*Primary Examiner*—John Kight, III
*Assistant Examiner*—Richard Jones
*Attorney, Agent, or Firm*—Andrew F. Sayko, Jr.

[57] ABSTRACT

The present invention provides mixture of at least two novolak resins with a molecular weight distribution overlap of at least 50% and having dissolution rates which differ by a factor of at least 2.0. A method is also provided for producing such novolak resin mixtures.

6 Claims, 10 Drawing Sheets

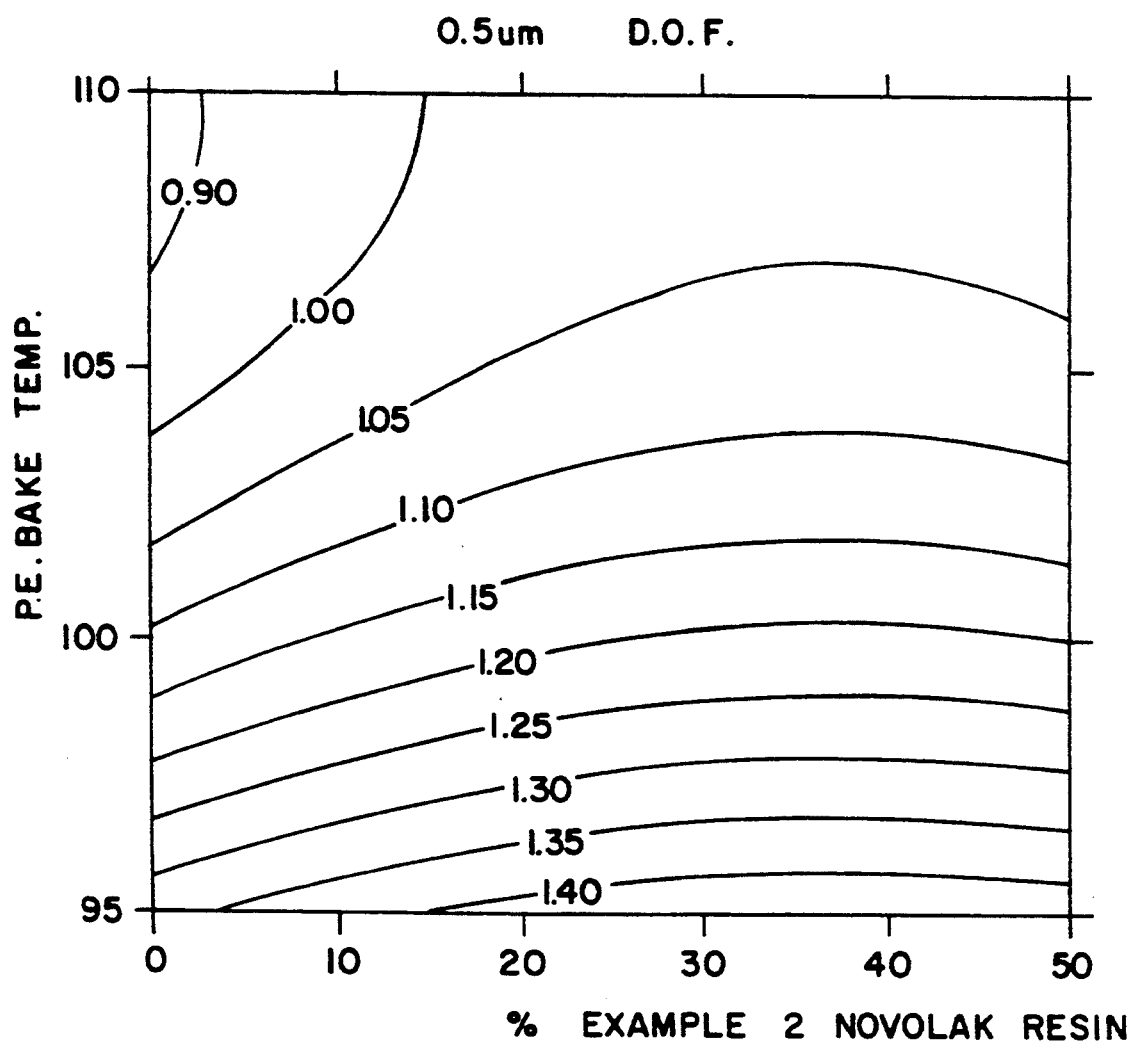

NOVOLAK RESIN MIXTURES

BACKGROUND OF THE INVENTION

The present invention relates to a mixture of alkali soluble novolak resins having different dissolution rates and to a process for producing such which are especially useful in positive photoresist compositions which are especially sensitive in the i-line range of the spectrum.

Photoresist compositions are used in microlithography processes for making miniaturized electronic components such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

Novolak resins are frequently used as a polymeric binder in liquid photoresist formulations. These resins are typically produced by conducting a condensation reaction between formaldehyde and one or more multi-substituted phenols, in the presence of an acid catalyst, such as oxalic acid. There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure to the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The prior art discloses mixtures of two novolak resins with the same composition, but with different molecular weights. Because the molecular weight distribution in these resins consists of two different sub-distributions of molecular weight, such resins have been characterized as bimodal.

The present invention relates to the surprising discovery that an improved novolak resin for use in photoresist compositions is obtained by utilizing a mixture of resins having similar molecular weights and similar molecular weight distributions, but each having a different dissolution rate. Although there is no known method for measuring dissolution rate distribution in a manner which is analogous to molecular weight distribution, the resins of the present invention may be characterized as Bimodal Dissolution Rate (BDR) resins. BDR resins are defined as resins having the following characteristics:

a) a film forming resins useful for photoresist compositions;

b) comprising a mixture of at least two resins, with the same or different chemical composition, for which the molecular weight distribution of the two component resins, normalized to the same area, show an overlap of at least fifty percent (50%), preferably 60–100%, more preferably 70–95%, and for which the dissolution rates of the two component resins differ by a factor of at least 2.0, preferably 2.0 to about 6.0, most preferably from about 2.5 to about 4.5.

In formulating the BDR resins of the present invention, two or more of the following resins, which do not meet the criteria for a BDR resin, may be utilized: 1) any resins which are the products of a polycondensation reaction between one or more phenolic monomers and formaldehyde, or 2) a mixture of such reaction products. Molecular weight and molecular weight distribution, as used above, are defined via a GPC versus polystyrene standard, not as absolute values.

The mixture of phenolic monomer(s)/formaldehyde resins enables one to formulate photoresist compositions which display improved, or at least equivalent, thermal stability when compared to a photoresist composition formulated using only the component resin having the higher thermal stability. Such photoresist compositions display improved thermal stability when compared to a photoresist composition formulated using the component resin having the lower thermal stability.

Such photoresist compositions also provide semiconductor devices having a very good pattern profile, a low degree of scumming, no standing wave and very good depth of focus. They also provide a wide process window when producing semi-conductor devices.

The subject invention provides a water insoluble, aqueous alkali soluble film forming novolak resin which can be used to form a substantially uniform photoresist composition, the novolak resin comprising a mixture of at least two novolak resins, with the same or different chemical composition, for which the molecular weight distribution of the component resins, normalized to the same area, show an overlap of at least fifty percent (50%) and for which the dissolution rates of the component resins differ by a factor of at least 2.0.

The present invention provides a process for formulating a water insoluble, aqueous alkali soluble film forming novolak resin which is useful for providing a substantially uniform photoresist composition, by mixing at least two novolak resins, with the same or different chemical composition, for which the molecular weight distribution of the component resins, normalized to the same area, show an overlap of at least fifty percent (50%) and for which the dissolution rates of the component resins differ by a factor of at least 2.0.

DETAILED DESCRIPTION OF THE PREFERRED EMBODIMENTS

Figure 1:
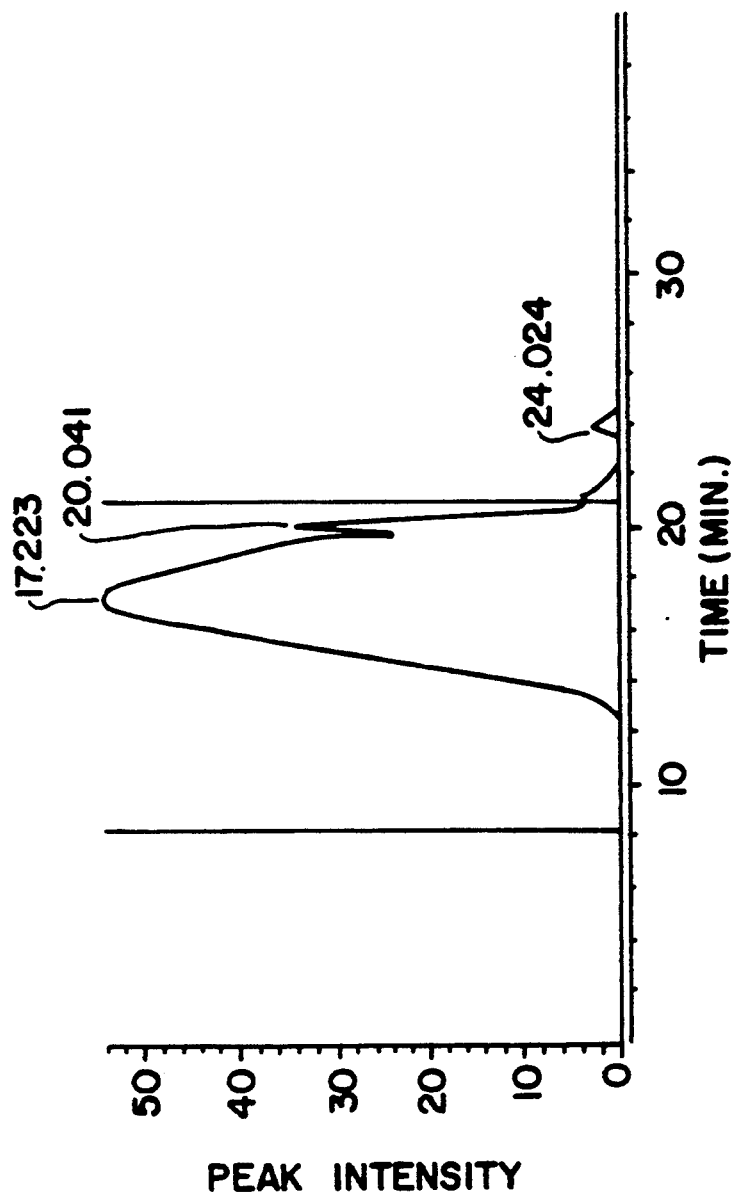

Novolak resins have been commonly used in the art of photoresist manufacture as exemplified by "Chemistry and Application of Phenolic Resins", Knop A. and Scheib, W.; Springer Verlag, New York, 1979 in Chapter 4. Similarly, o-quinone diazides are well known to the skilled artisan as demonstrated by "Light Sensitive Systems", Kosar, J.; John Wiley & Sons, New York, 1965 Chapter 7.4. These resins are typically produced by conducting a condensation reaction between formaldehyde and one or more multi-substituted phenols, in the presence of an acid catalyst, such as oxalic acid.

Suitable multi-substituted phenols are well known in the prior art and include meta-cresol, para-cresol, 3,5-xylenol and 3,5-dimethylphenol.

The sensitizer which comprises a component of photoresist compositions may be an ester of a multihydroxy phenolic or alcoholic compound, such as a trishydroxyphenylethane or a hydroxybenzophenone, and a sulfonic acid or sulfonic acid derivative such as a sulfonyl chloride, such as described in U.S. Pat. Nos. 3,106,465 and 4,719,167, which are incorporated herein by reference.

In a more preferred embodiment, the photosensitizer is a polyhydroxy-substituted aromatic compound of formula I, or a mixture of compounds of formula I.

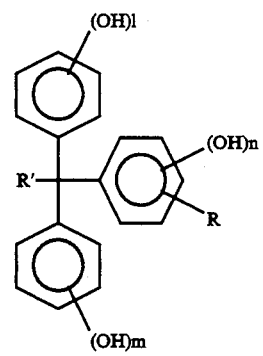

where l, m and n are numbers in the range of 0 to 3 inclusive; and where, if $n>0$, R=hydrogen, alkyl (e.g. $C_1$ to $C_5$ alkyl), aryl (e.g. phenyl, naphthyl) or alkylaryl (e.g. $C_1$ to $C_5$ alkyl substituted phenyl or naphthyl); and where, if $n=0$, R=hydrogen, alkyl (e.g. $C_1$ to $C_5$ alkyl), hydroxyaryl (e.g. phenyl, naphthyl), preferably monohydroxyaryl, most preferably 4-hydroxyphenyl), alkylaryl (e.g. $C_1$ to $C_5$ alkylphenyl or alkylnaphthyl), preferably hydroxysubstituted and bound to the aromatic ring by a methylene, a 1-ethylidene or 2-isopropylidene bridge, most preferably 4-hydroxyphenyl-2-isopropylidene, -1 -ethylidene or -methylene; and where R' is hydrogen, alkyl (e.g. $C_1$ to $C_5$ alkyl), or cycloalkyl (e.g. $C_1$ to $C_6$ cyclo, $C_1$ to $C_5$ alkyl).

The photoresist composition is formed by blending the ingredients in a suitable solvent. Generally, the amount of novolak resin in the photoresist preferably ranges from 70% to about 90% and more preferably from about 75% to about 85% based on the weight of the solid; i.e., non-solvent photoresist components. The photosensitizer is generally present in the photoresist in an amount of from about 10% to about 30% preferably from about 15% to about 25%, based on the weight of the solids photoresist components.

Suitable solvents for such photoresists may include propylene glycol mono-alkyl ether, propylene glycol alkyl (e.g. methyl) ether acetate, ethyl-3-ethoxypropionate, ethyl lactate, mixtures of ethyl-3-ethoxypropionate and ethyl lactate, butyl acetate, xylene, diglyme, ethylene glycol monoethyl ether acetate. The preferred solvents are propylene glycol methyl ether acetate (PGMEA) and ethyl-3-ethoxypropionate (EEP).

Other optional ingredients such as colorants, dyes, anti-striation agents, leveling agents, plasticizers, adhesion promoters, speed enhancers, solvents and such surfactants as non-ionic surfactants may be added to the solution of novolak resin, sensitizer and solvent before the photoresist composition is coated onto a substrate.

The skilled artisan will know that dyes are often selected which absorb strongly at a wavelength corresponding to the wavelength of light used in one or more lithographic process steps, and particularly corresponding to the wavelength of the exposing radiation.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045), Neutral Red (C.I. No. 50040), Sudan Orange (C.I. 11920), Curcumin (C.A.S. Reg. No. 458-37-7), Coumarin 1 (C.A.S. Reg. No. 91-44-1), Coumarin 7 (C.A.S. Reg. No. 27425-55-4), Coumarin 314 (C.A.S. Reg. No. 55804-66-5), Disperse Yellow 9 (C.I. 10375), Alizarin Yellow GG (C.I. 14025), Alizarin Yellow R (C.I. 14030), Basic Yellow 1 (C.I. 49005 and 3,3'-carbonylbis (7-diethylaminocoumarin) (C.A.S. Reg. No. 63226-13-1) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of film forming resin and sensitizer. Plasticizers which may be used include, for example, phosphoric acid tri(-beta-chloroethyl)-ester; stearic acid; dicamphor; acetal resins; phenoxy resins; and alkyl resins, at about one to ten percent weight levels, based on the combined weight of film forming resin and sensitizer. The plasticizer additives improve the coating properties of the material and enable the application of a film that is smooth and of uniform thickness to the substrate.

Adhesion promoters which may be used include, for example, beta(3,4-epoxy-cyclohexyl)-ethyltrimethoxysilane; p-methyl-disilane-methyl methacrylate; vinyltrichlorosilane; and gamma-amino-propyl triethoxysilane up to about a 4 percent weight level, based on the combined weight of film forming resin and sensitizer. Development speed enhancers that may be used include, for example, picric acid, nicotinic acid or nitrocinnamic acid up to about a 20 percent weight level, based on the combined weight of film forming resin and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the photoresist composition. Solvents, of course are substantially removed after coating of the photoresist solution on a substrate and drying.

The prepared photoresist composition solution, can be applied to a substrate by any conventional method used in the photoresist art, including dipping, spraying, whirling and spin coating. When spin coating, for example, the resist solution can be adjusted with respect to the percentage of solids content, in order to provide a coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures: gallium arsenide and other such Group III/V compounds.

Such photoresist coatings produced by the described procedures are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 120° C. for from about 30 seconds to about 180 seconds on a hot plate or for from about 15 to about 90 minutes in a convection oven (Soft Bake). This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the treatment temperature is from about 90° C. to about 120° C. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment (PEB) either before or after development. The heating temperatures may range from about 80° C. to about 120° C., more preferably from about 90° C. to about 120° C. The heating may be conducted for from about 30 seconds to about 2 minutes, more preferably from about 60 seconds to about 90 seconds on a hot plate or about 30 minutes to about 45 minutes in a convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

Synthesis of Novolak Resin using m-cresol and 3,5-xylenol (6,23:3 Ratio)

Into a two liter four necked flask equipped with a thermometer, stirring shaft, condenser and a dropping funnel were added 162.12 grams (1.5 moles) meta-cresol, 88.23 grams (0.722 moles) 3,5-Xylenol, 170 grams dipropylene glycol methyl ether (DPGME) solvent and 0.625 grams oxalic acid (about 0.25% by weight of total phenols). The flask was heated slowly from room temperature using a heating mantle controlled by a thermo-watch. The contents of the flask were gently stirred. The reaction contents were heated to 95° C. and when the temperature was stablized at 95° C., 126 grams (37.28%) formaldehyde solution was added by dropping funnel over a period of 90 minutes. The cresol:formaldehyde ratio was 1:0.7. The condensation was then carried out at 95° C. for six hours. After condensation at 95° C., the distillation was carried out at atmospheric pressure to remove water. The temperature was increased up to 200° C. and excess cresol and solvent were removed under vaccum (35 mm Hg) at a temperature from 200° to 220° C. The vaccum was released at 220° C. and the molten resin was poured into an aluminum pan. The resin obtained had a viscosity of 10.7 (7.0% solution in Cyclohexanone), a Glass transition Temperature (Tg=105° C.), Dissolution Rate=1.8 to 2.7 microns/minute using 2.38% Tetra Methyl Ammonium Hydroxide (TMAH) AZ300 MIF developer, a relative molecular weight (RMW) of about 10 and a GPC Molecular Weight Distribution as shown in FIG. 1.

FIG. 1 is a graph showing the GPC molecular weight distribution for the novolak resin of Example 1. The graph shows the Peak Intensity plotted as a function of the time in minutes.

EXAMPLE 2

Synthesis of Novolak Resin using m-cresol and 3,5-xylenol, (10:3,35 Ratio)

Into a 500 ml. four necked flask equipped with a thermometer, stirring shaft, condenser and a dropping funnel were added 115.35 grams (1.0667 moles) meta-cresol, 43.6 grams (0.35699 moles) 3,5-Xylenol, 76.13 grams diglyme solvent and 1.588 grams maleic anhydride (2.0% by weight of total phenols). The flask was heated slowly from room temperature using a heating mantle controlled by a thermo-watch. The contents of the flask were gently stirred. The reaction contents were heated to 95° C. When the temperature was stablized at 95° C., 87.9 grams (37.28%) formaldehyde solution was added by dropping funnel over a period of one hour. The condensation was then carried out at 95° C. for four hours. After condensation at 95° C., the distillation was carried out at atmospheric pressure to remove water. The temperature was increased to 200° C. and excess cresol and solvent were removed under vaccum (35 mm Hg) at a temperature from 200° to 220° C. The vaccum was released at 220° C. and the molten resin was poured into an aluminum pan. The resin obtained had a viscosity of 8.4 (7.0% solution in Cyclohexanone), a Glass transition Temperature (Tg=92° C.), a Dissolution Rate=6.0 microns/minute using AZ 300 MIF developer, an RMW of about 10 and a GPC Molecular Weight Distribution as shown in FIG. 2.

Figure 2:
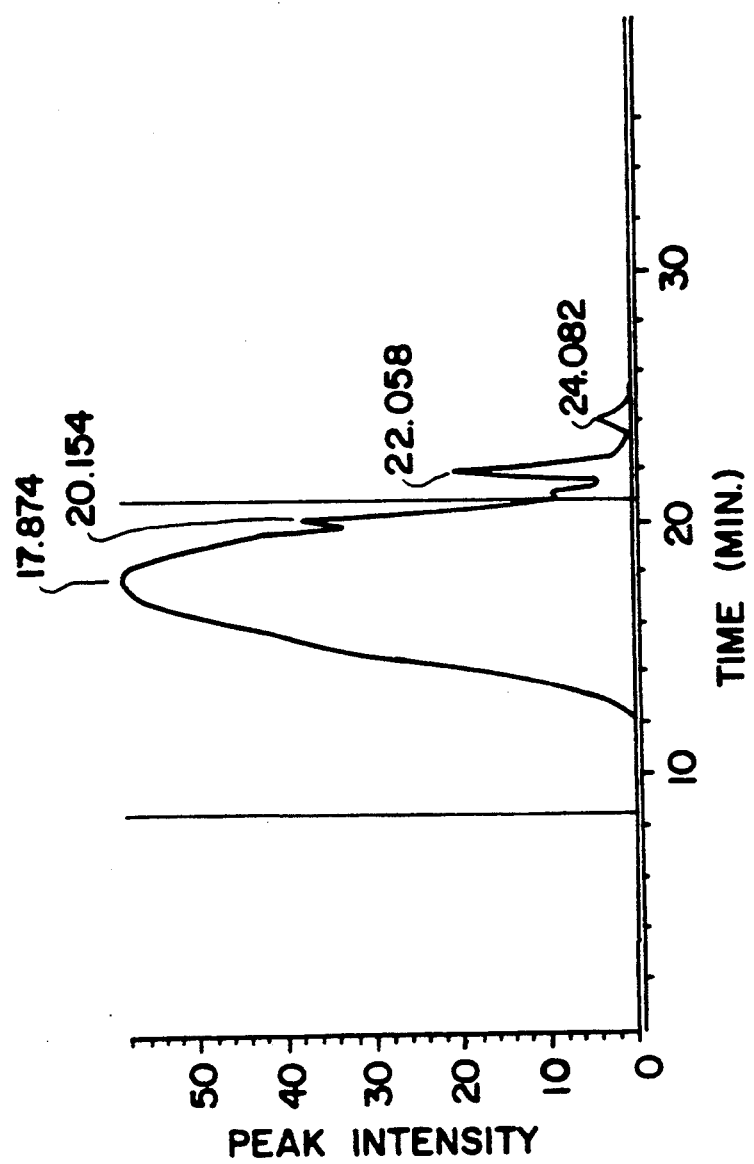

FIG. 2 is a graph showing the GPC molecular weight distribution for the novolak resin of Example 2. The graph shows the Peak Intensity plotted as a function of the time in minutes.

Example 3

Synthesis of Novolak Resin using m-cresol and 3,5-xylenol (6,23:3 Ratio)

Into a two liter four necked flask equipped with a thermometer, stirring shaft, condenser and a dropping funnel were added 162.12 grams (1.5 moles) meta-cresol, 88.08 grams (0.722 moles) 3,5-Xylenol, 170 grams DPGME solvent and 0.625 grams oxalic acid (0.25% by weight of total phenols). The flask was heated slowly from room temperature using a heating mantle controlled by a thermo-watch. The contents of the flask were gently stirred. The reaction contents were heated to 95° C. When the temperature was stablized at 95° C., 121.6 grams (37.28%) formaldehyde solution was added by dropping funnel over a period of 90 minutes. The condensation was then carried out at 95° C. for six hours. After condensation at 95° C., the distillation was carried out at atmospheric pressure to remove water. The temperature was increased up to 200° C. and excess cresol and solvent were removed under vaccum (35 mm Hg) at a temperature from 200° to 220° C. The vaccum was released at 220° C. and the molten resin was poured into an aluminum pan. The resin obtained had a viscosity of 9.0 (7.0% solution in Cyclohexanone), a Glass transition Temperature (Tg=90° C.), a Dissolution Rate=4.5-6.0 microns/minute using AZ300 MIF developer, a relative molecular weight (RMW) of about 8 and a GPC Molecular Weight Distribution as shown in FIG. 3.

Figure 3:
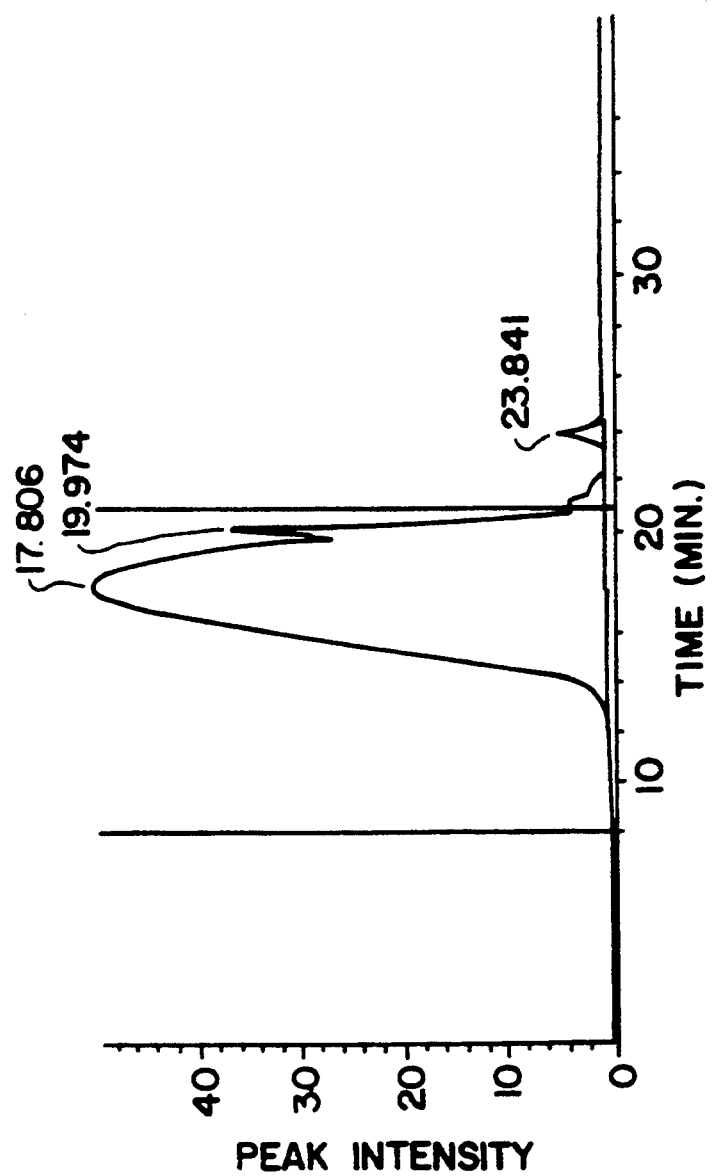

FIG. 3 is a graph showing the GPC molecular weight distribution for the novolak resin of Example 3. The graph shows the Peak Intensity plotted as a function of the time in minutes. Based on FIG. 1, 2, and 3: 1) a combination of the novolak resins of Examples 1 and 2 had an overlap of molecular weight distribution of greater than about ninety percent (90%) and 2) a combination of the novolak resins of Examples 1 and 3 had an overlap of molecular weight distribution of greater than about eighty five percent (85%).

EXAMPLE 4

Photoresist compositions were produced by adding to a 500 ml. flask: 4.5 grams of 70% L-sulfonyl chloride/30% F-sulfonyl chloride (70L/30F) trihydroxyphenylethane photosensitizer (18% by weight of the solids), 75 grams of PGMEA solvent and the following amounts of the novoalk resins of Examples 1 and 2. The mixtures were stirred at room temperature to form photoresist solutions (all percentages are by weight of solids):

|    | Example 1 Novolak   | Example 2 Novolak   |
| -- | ------------------- | ------------------- |
| A) | 20.500 gm. (82%)    | —                   |
| B) | 15.375 gm. (61.5%)  | 5.125 gm. (20.5%)   |
| C) | 10.250 gm. (41%)    | 10.250 gm. (41%)    |
| D) | 5.125 gm. (20.5%)   | 15.375 gm. (61.5%)  |
| E) | —                   | 20.500 gm. (82%)    |

The photoresist solutions were each coated on to a 4″ silicon wafer at the appropriate speed on a SVG coat-development track system, then preexposure baked on a hot plate for 60 seconds at 95° C., to obtain a 0.975 μm film. The film thickness is determined on a Autonanospec (NANOMETRICS, model 215), an automated film thickness measurement system, measuring 10 point across the entire wafer. The wafers were then exposed to a NIKON i-line stepper (0.54 NA) with a NIKON resolution reticle. An 11×21 focus/exposure matrix is used to print a pattern on the resist film. The exposed wafer were post exposure baked (PEB) at 110° C. for 60 seconds on a hot plate. The resists were subsequently spray-pudele developed for 45 seconds at 23.5° C., using TMAH AZ300 MIF developer (available from Hoechst Celanese Corporation, Somerville, N.J.). The developed resist pattern were examined by a Hitachi S-4000 field emission scanning electron microscope. The lithographic results of the samples are presented in the table below where:

$E_{nominal}$ = minimum dose (millijoules/cm.$^2$) required to replicate 1:1 the various feature sizes on the reticle Resolution = smallest feature size (microns) opened with an acceptable pattern profile (pattern edge acuity > 80°)

Depth of focus = the extend of defocus (microns) of the optical exposure system where the resist is able to maintain an acceptable pattern profile and within ±10% of the critical dimension (CD) at the $E_{nominal}$ Scum = resist residue left at the exposed areas after development.

Lithographic Performance of the Resist

| Sample | E (nominal) | Resolution (μ) | DOF (0.5μ) | Scum |
|---|---|---|---|---|
| A | 240 mJ/cm$^2$ | 0.35 | 1.4 μm | no |
| B | 200 | 0.40 | 1.4 μm | no |
| C | 210 | 0.35 | 1.4 μm | no |
| D | 200 | 0.35 | 1.4 μm | slightly |
| E | 160 | 0.35 | 1.4 μm | yes |

Sample A doesn't possess the process window needed to achieve the optimal thermal flow temperature, exposure latitude, depth of focus or $E_{nominal}$.

EXAMPLE 5

Photoresist compositions were produced by adding to a 500 ml. flask: 50 grams of 70L/30F trihydroxyphenylethane photosensitizer (20% by weight of the solids), 75 grams of PGMEA solvent and the following amounts of the novolak resins of Examples 1 and 2. The mixtures were stirred at room temperature to form photoresist solutions (all percentages are by weight of solids).

|  | Example 1 Novolak | Example 2 Novolak |
|---|---|---|
| A) | 20.00 gm. (80%) | 0.00 gm. (0%) |
| B) | 18.00 gm. (72%) | 2.00 gm. (8%) |
| C) | 16.00 gm. (64%) | 4.00 gm. (16%) |
| D) | 14.00 gm. (56%) | 6.00 gm. (24%) |
| E) | 12.00 gm. (48%) | 8.00 gm. (32%) |
| F) | 10.00 gm. (40%) | 10.00 gm. (40%) |

The photoresist samples of Example 5 were processed using the same conditions described in Example 4, except the resist thickness used was 1.185 μm and the post exposure bake temperatures used were 95° C. to 110° C.

$E_{clear}$ = minimum dose (millijoules/cm.$^2$) required to dissolve all the resist at the exposed area upon developing, typically is fraction of the $E_{nominal}$ Exposure Latitude = percentage range of the exposure dose tolerated by the resist to print the pattern of a given feature size within ±10% of its Critical Dimension DOF (0.5 μm) = depth of focus (microns) for 0.5 μm feature size, determined by the method described in Example 4

Thermal Flow Temperature = lowest temperature (° C.) at which the resist pattern start to flow or deform The results (see FIGS. 4 to 8 contour plots) clearly showed the benefit of using a novolak resin system comprising resin component with Bimodal Dissolution Rate, such as by blending various proportion of Example 2 novolak with the Example 1 novolak.

Figure 4:
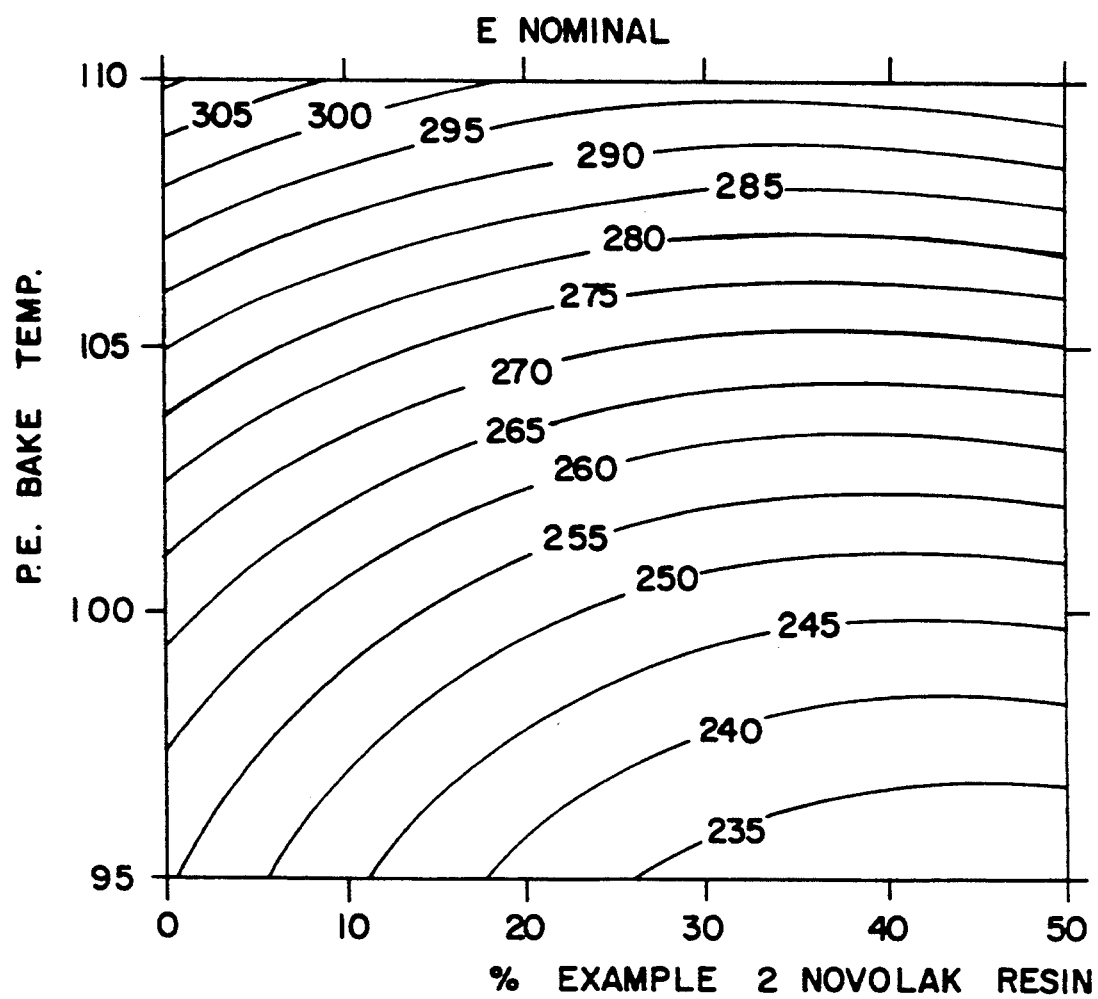

FIG. 4 is a contour plot of $E_{nominal}$ of the photoresist of Example 5 at Post Exposure (P.E.) Bake Temperatures from 95° C. to 110° C. The plot shows $E_{nominal}$ decreased (i.e., photoresist photosensitivity increased) as the PEB temperatures decreased or the concentration of Example 2 novolak increased from 0% to 50% by weight. It also clearly showed using Example 1 novolak alone would not offer low $E_{nominal}$, even at a lower PEB temperature, which was found to give a lower thermal flow temperature.

Figure 5:
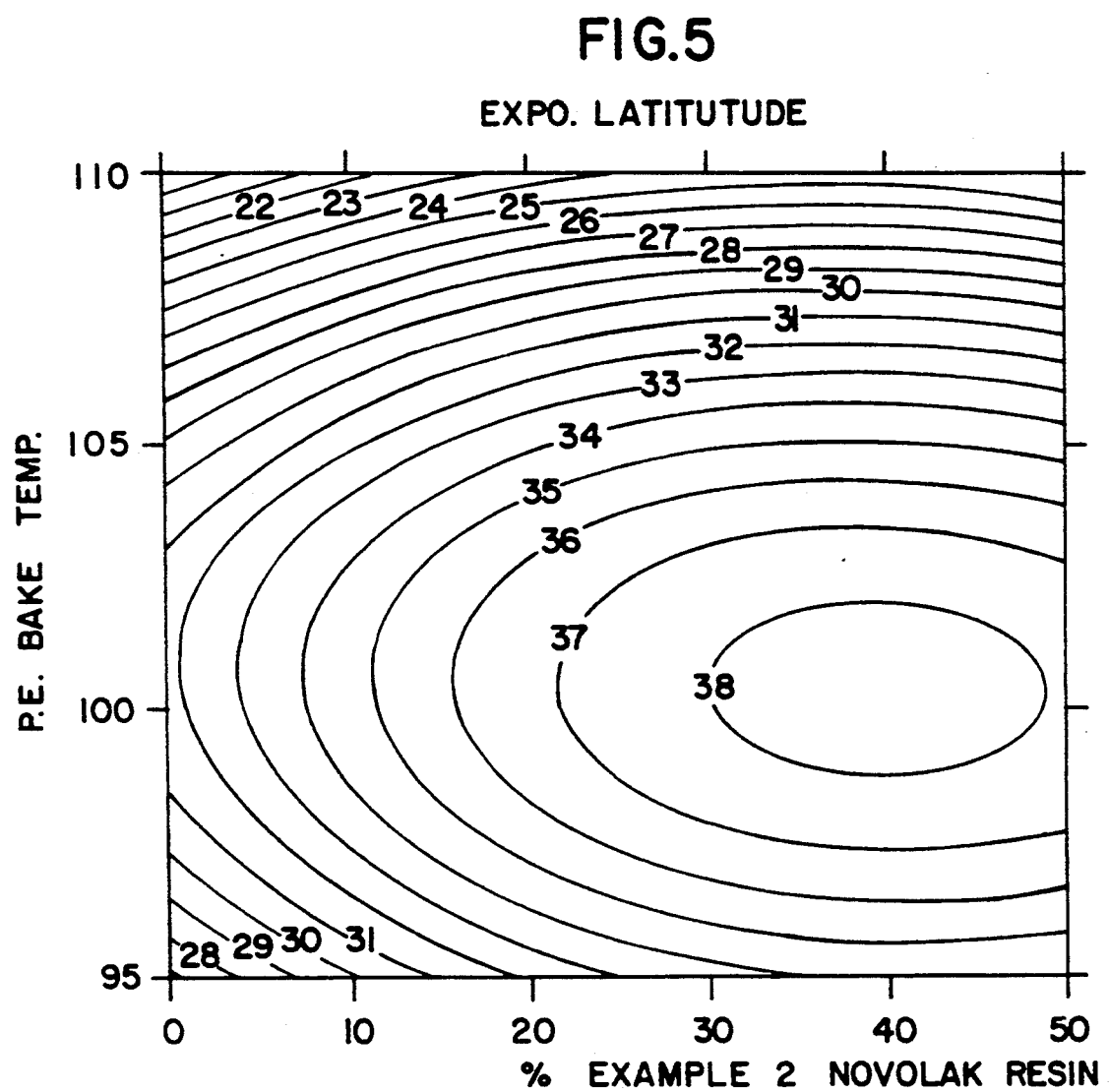

FIG. 5 is a contour plot of Exposure (Expo.) Latitude of the Example 5 photoresists at PEB temperatures from 95° C. to 110° C. This plot shows the exposure latitude increased as the Example 2 novolak content increased. The optimal exposure latitude is not achievable using 100% Example 1 novolak regardless of the PEB temperature used.

Figure 6:
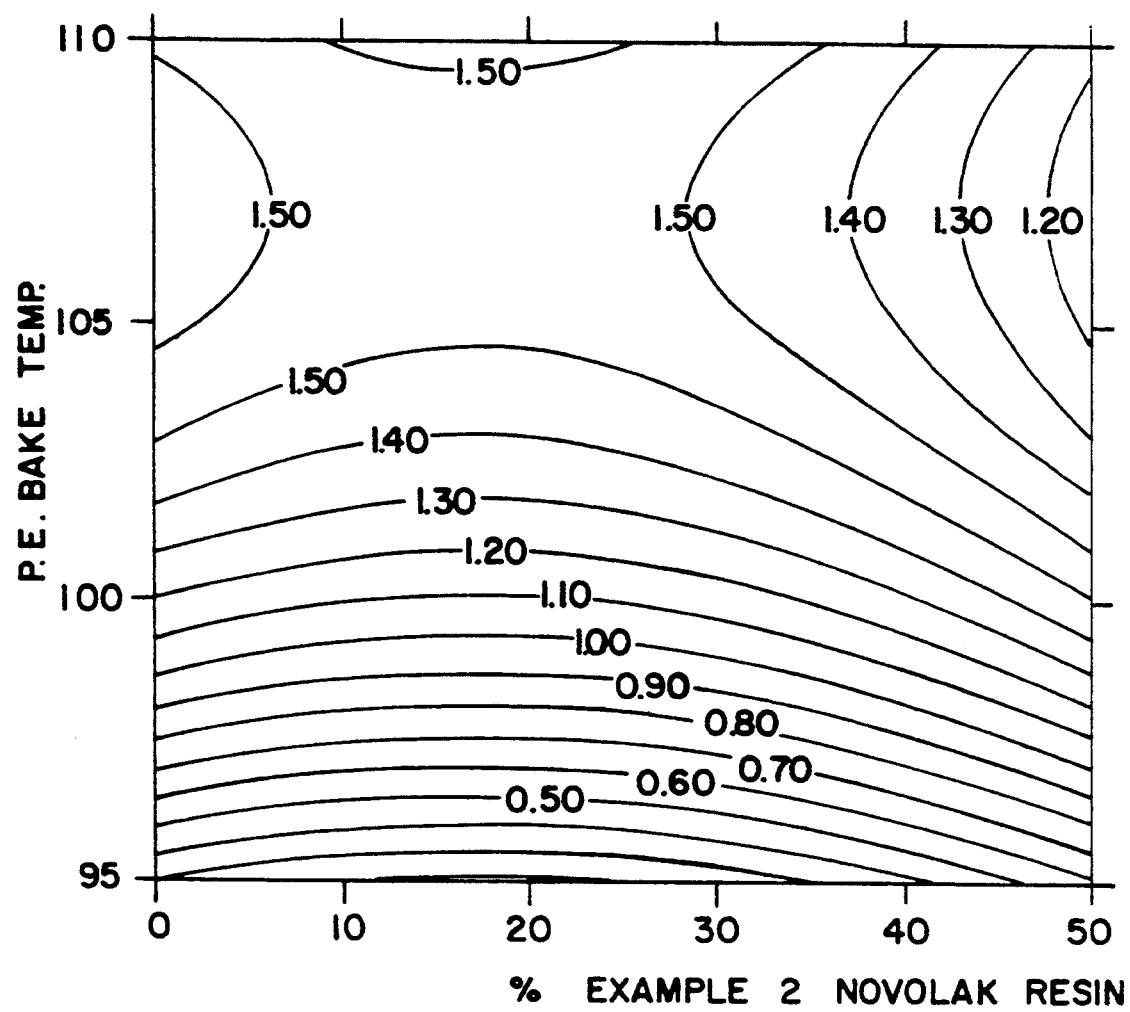

FIG. 6 is a contour plot of the Depth of Forcus (DOF) of a 0.5μ photoresist pattern using the photoresists of Example 5 at PEB temperatures from 9520 C. to 110° C. Incorporation of some Example 2 novolak in the resin offered the best DOF.

Figure 7:
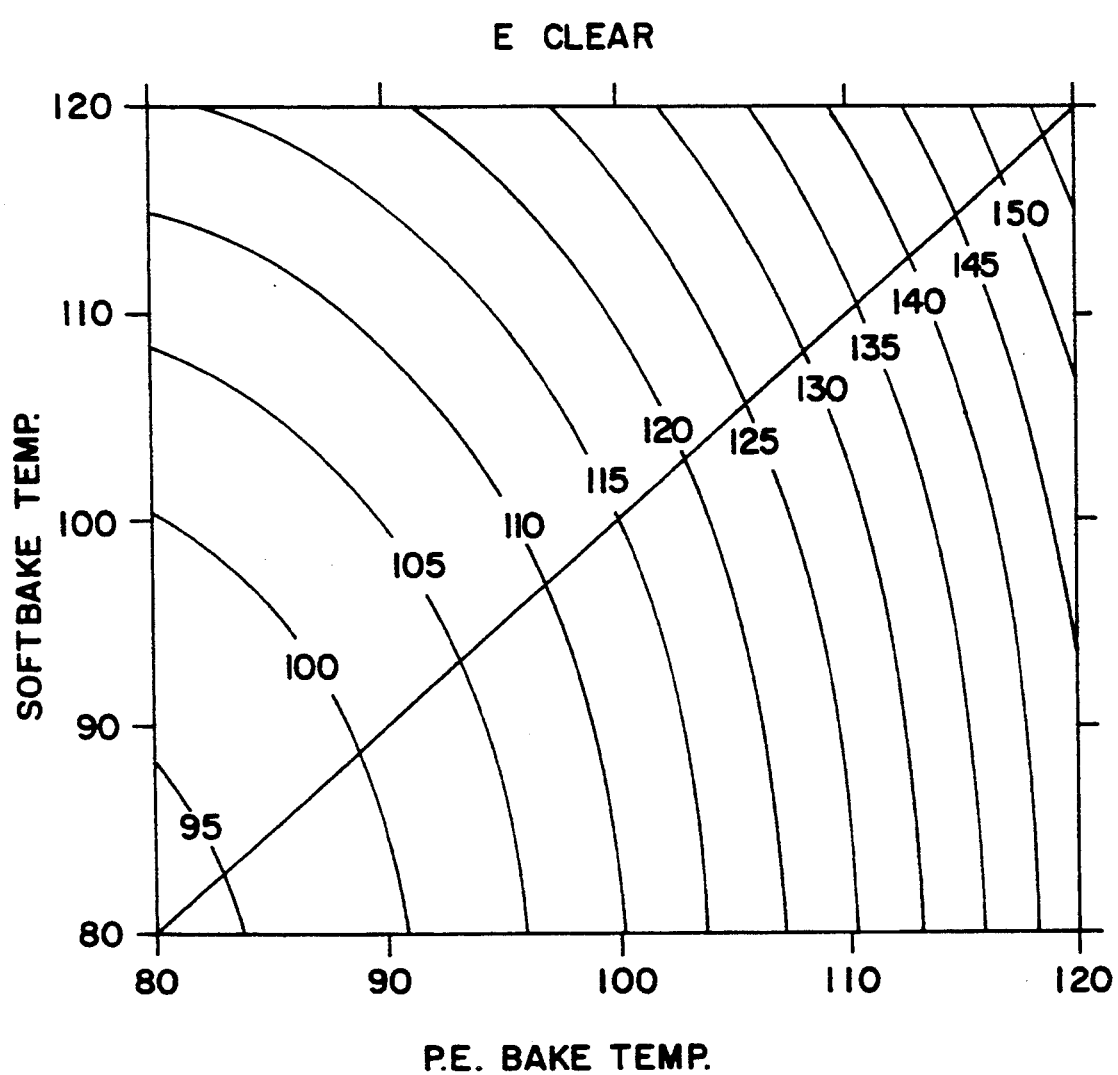

FIG. 7 is a contour plot of $E_{clear}$ of the photoresist of Example 5 having a novolak resin content of 80% by weight of the solids in the photoresist composition at PEB temperatures from 95° C. to 110° C. and soft bake (SB, i.e. pre-exposure bake temperatures of 80° C. to 120° C. The development time was 52 seconds using AZ 300 MIF developer. $E_{clear}$ increased as the SB and PEB temperatures increased.

Figure 8:
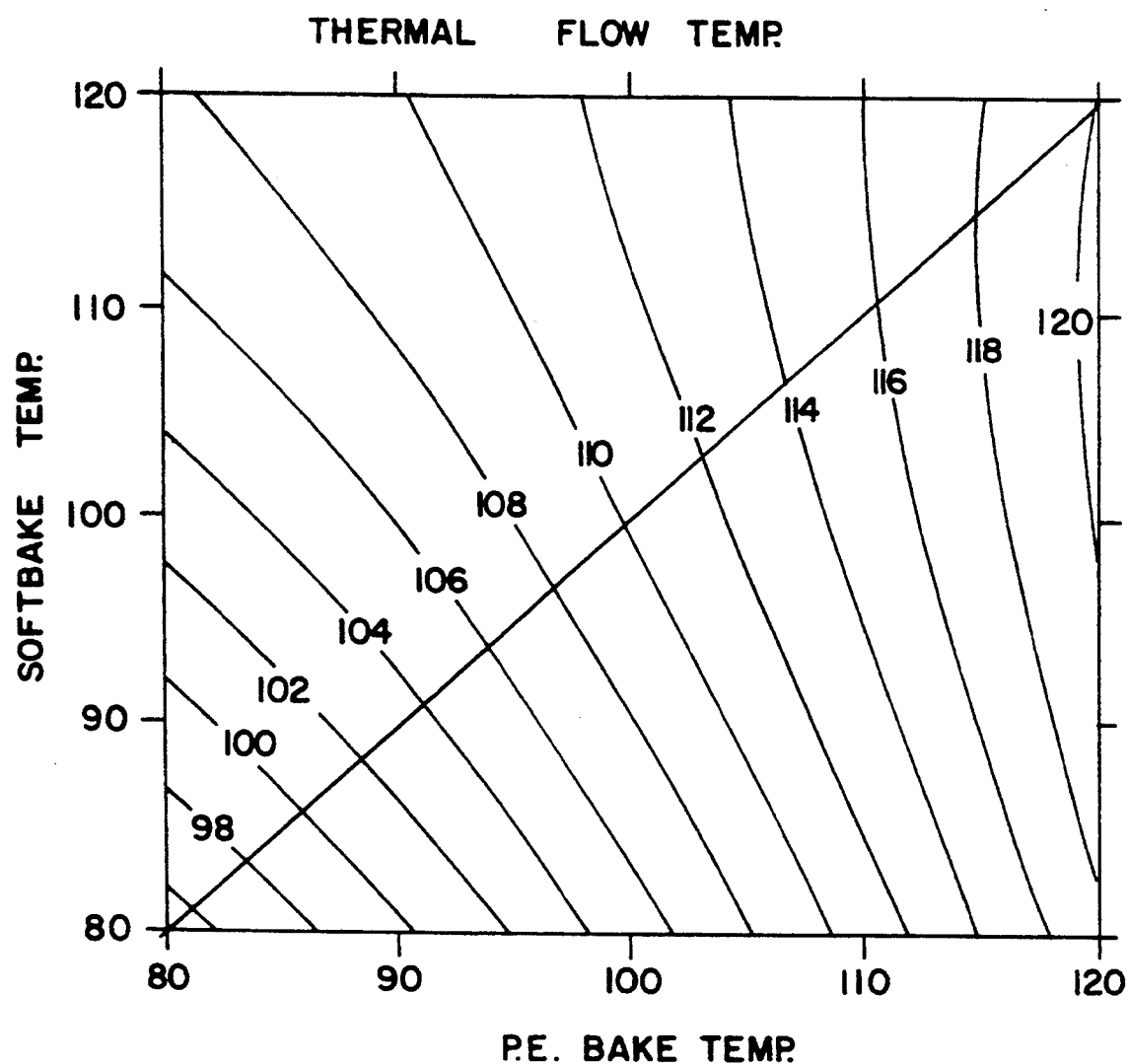

FIG. 8 is a contour plot of the thermal flow temperature of the photoresist of Example 5 having a novolak resin content of 80% by weight of the solids in the photoresist composition at PEB temperatures from 95° C. to 110° C. and SB temperatures of 80° C. to 120° C. The development time was 52 seconds using AZ 300 MIF developer. As clearly shown in this plot, higher SB and PEB temperatures increased the pattern thermal flow temperature of the subject photoresist.

EXAMPLE 6

Photoresist compositions were produced by adding to a 500 ml. flask: 5.0 grams of 70L/30F trihydroxyphenylethane photosensitizer (18% by weight of the solids), 75 grams of PGMEA solvent and the following amounts of the novolak resins of Examples 1 and 2. The mixtures were stirred at room temperature to form photoresist solutions (all percentages are by weight of solids).

|  | Example 1 Novolak | Example 2 Novolak |
|---|---|---|
| A) | 20.00 gm. (82%) | 0.00 gm. (0%) |
| B) | 18.00 gm. (73.8%) | 2.00 gm. (8.2%) |
| C) | 16.00 gm. (65.6%) | 4.00 gm. (16.4%) |

-continued

|   | Example 1 Novolak | Example 2 Novolak |
| --- | --- | --- |
| D) | 14.00 gm. (57.4%) | 6.00 gm. (24.6%) |
| E) | 12.00 gm. (49.2%) | 8.00 gm. (32.8%) |
| F) | 10.00 gm. (41%) | 10.00 gm. (41%) |

The photoresist samples of Example 6 were processed using the same conditions described in Example 4, except the resist thickness used was 1.185 μm and the post exposure bake temperatures used were 95° C. to 110° C.

Figure 9:
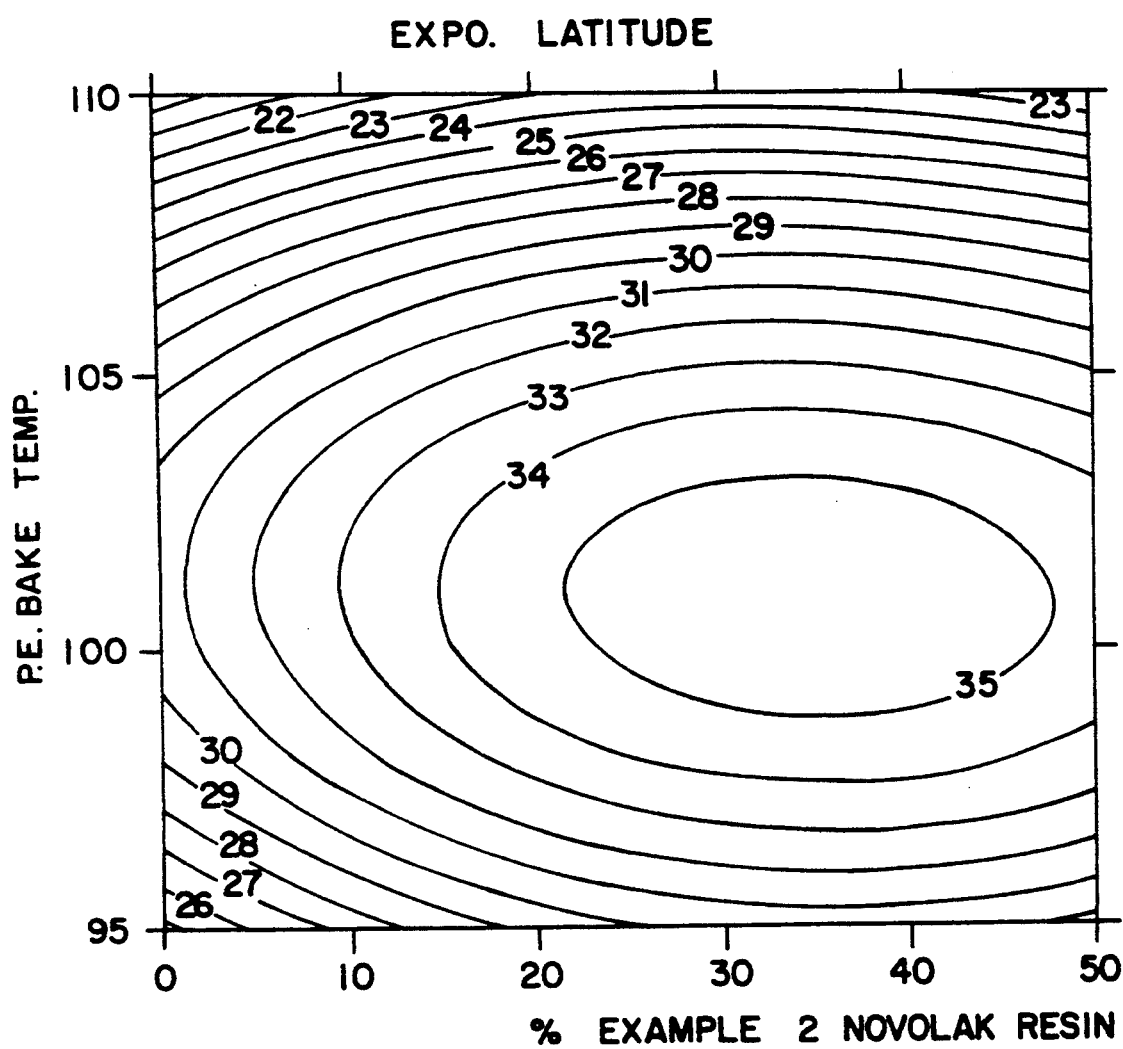

FIG. 9 is a contour plot of the Expo. Latitude of the photoresists of Example 6 at PEB temperatures from 95° C. to 110° C. The plot showed the same trend as those seen in FIG. 5 for Example 5. Incorporation of some of the Example 2 novolak improved the expo. latitude. Resists in this example contained lower sensitizer concentration, as compared to those resists in Example 5.

FIG. 10 is a contour plot of the DOF of a 0.5μ photoresist pattern using the photoresists of Example 6. Similar to the results found in Example 5, DOF improved with the incorporation of some of the Example 2 novolak.

EXAMPLE 7

Photoresist compositions were produced by adding to a 500 ml. flask: various amount of 70L/30F trihydroxyphenylethaane photosensitizer (20%, 19%, 18% by weight of solid), 75 grams of PGMEA solvent and the following amounts of the novolak resins of Example 1, 2 and 3. The mixtures were stirred at room temperature to form photoresist solutions (all percentages are by weight of solids)

|   | Exp. 1 Novolak | Exp. 2 Novolak | Exp. 3 Novolak | PAC |
| --- | --- | --- | --- | --- |
| A) | 20 gm (80%) | 0 gm (0%) | 0 gm (0%) | 5 gm (20%) |
| B) | 0 (0%) | 20 (80%) | 0 (0%) | 5 (20%) |
| C) | 10 (40%) | 0 (0%) | 10 (40%) | 5 (20%) |
| D) | 10.125 (40.5%) | 0 (0%) | 10.125 (40.5%) | 4.75 (19%) |
| E) | 10.25 (41%) | 0 (0%) | 10.25 (41%) | 4.5 (18%) |

| Lithographic Performance of the Resist | | | | |
| --- | --- | --- | --- | --- |
| Sample | E (nominal) | Resolution (μ) | DOF (0.5μ) | Scum |
| A | 240 mJ/cm$^2$ | 0.35 | 1.4 μm | no |
| B | 160 | 0.35 | 1.4 μm | yes |
| C | 190 | 0.35 | 1.4 μm | no |
| D | 160 | 0.35 | 1.4 μm | no |
| E | 170 | 0.40 | 1.4 μm | no |

Solution Viscosity—Relative Molecular Weight (RMW)

The viscosity solution was prepared by dissolving 7 grams of novolak resin in a 100 ml. volumetric flask, using cyclohexanone solvent. The solution was filtered using a 5 micron pressure syringe filter. The viscosity was measured using a Cannon-fenske #200 viscometer at 25° C. The relative molecular weight (RMW) was determined using the following equation:

$$M\,rel = \left[1/C \log\left(\frac{n}{no}\right)\right]^2$$

where c = concentration of resin in g/ml.
n = viscosity of resin in cyclohexanone
no = viscosity of cyclohexanone

Dissolution Rate Measurement

Formulations

Dissolve 26% resin solids in PGMEA. Filter through a 0.2 μm disposable Acrodisc filter.

Reference Standards

S-Resin Stock #D9922A produced by Hoechst Celanese Corporation (supplied in PGMEA solvent).

Dissolution Rate Measurement Procedure:

1. Each sample was coated on a 4 inch silicon wafer, at the appropriate speed, on an SVG coat-development track system, then baked on a hot plate for 60 seconds at 90° C., to obtain a 1.29 μm film.
2. The film thickness was determined on an Autonanospec (NANOMETRICS, model 215), an automated film thickness measurement system, measuring 10 points across the entire wafer.
3. The Dissolution Rate was determined by measuring the film thickness change with time using a laser end-point detection system consists of a He—Ne laser (634 nm, 3 mW, ORIEL CORP., Model 79202) and a photodiode. The development was performed at 23° C. using AZ300 MIF TMAH developer and the dissolution rate was calculated by the equation $$\Delta t = \lambda/2n$$

where λ is the wavelength of the laser, n is the index of reflection of the film material at that wavelength and Δt is the change in thickness that occurs in the time span between maxima (or minima) interference of the film during the dissolution process.

Molecular Weight Data (Mw and Mn)

The molecular weight of the polymers, whether weight average molecular weight Mw, or number average molecular weight Mn, were measured by gel permeation chromatography (GPC) performed on dilute solutions of the polymer in tetrahydrofuran (THF). The actual apparatus employed consisted of a Waters (Millipore Corp.) programmable automatic sampler, vacuum pump, chromatography columns with heater, and a differential refractometer connected to a Shimadzu CR 30A data reduction system with accompanying software (version 1.1, Shimadzu part No. T/N 22301309-91). The refractometer used was a Waters model 410 and four chromatography columns, 500 Angstrom, 1000 Angstrom, 10,000 Angstrom and 100,000 Angstrom (available from Waters) were connected in series. The system was calibrated using multiple available polystyrene standards ranging in molecular weight as follows:

| GPC CALIBRATION | |
| --- | --- |
| Calibration Standard (Polystyrene) | Mol. Wt. |
| 1 | 470,000 |
| 2 | 170,000 |
| 3 | 68,000 |
| 4 | 34,500 |
| 5 | 9,200 |
| 6 | 3,200 |

-continued

| GPC CALIBRATION | |
|---|---|
| Calibration Standard (Polystyrene) | Mol. Wt. |
| 7 | 1,250 |

The standards are essentially monodisperse, consisting substantially of a single molecular weight. With the system thus calibrated the weight average molecular weight (Mw), the number average molecular weight (Mn), and polydispersity (Mw/Mn), were obtained for polymers produced in accordance with the Examples.

Glass Transition Temperature (Tg)

Glass transition temperatures (Tg) were determined by differential scanning calorimetry using a Perkin Elmer DSC-4 calorimeter operating at 20° C./minute, nitrogen atmosphere at 60 cc/minute. Glass transition temperature by this method is generally defined as the point of intersection of tangent lines about the point of first inflection of the heating curve of the polymer.

We claim:

1. A water insoluble, aqueous alkali soluble film forming novolak resin consisting essentially of a mixture of at least two novolak resins, with the same or different chemical composition, for which the molecular weight distribution of the component resins, normalized to the same area, show an overlap of at least fifty percent (50%) and for which the dissolution rates of the component resins differ by a factor of 2.0 to about 6.0 said novolak resins being reaction products of formaldehyde with a mixture consisting essentially of meta-cresol and 3,5-xylenol.

2. The novolak resin mixture of claim 1 wherein the novolak resins show an overlap in molecular weight distribution of 60 to 100 percent.

3. The novolak resin mixture of claim 1 wherein the novolak resins show an overlap in molecular weight distribution of 70 to 95 percent.

4. A process for formulating a water insoluble, aqueous alkali soluble film forming novolak resin by mixing at least two novolak resins, with the same or different chemical composition, for which the molecular weight distribution of the component resins, normalized to the same area, show an overlap of at least fifty percent (50%) and for which the dissolution rates of the component resins differ by a factor of 2.0 to about 6.0, said novolak resins being reaction products of formaldehyde with a mixture consisting essentially of meta-cresol and 3,5-xylenol.

5. The process of claim 4 wherein the novolak resins show an overlap in molecular weight distribution of 60 to 100 percent.

6. The process of claim 4 wherein the novolak resins who an overlap in molecular weight distribution of 70 to 95 percent.

* * * * *